(12) United States Patent
Esaki

(10) Patent No.: US 7,488,543 B2
(45) Date of Patent: Feb. 10, 2009

(54) ALUMINUM NITRIDE CONJUGATE BODY AND METHOD OF PRODUCING THE SAME

(75) Inventor: Tatsuo Esaki, Yamaguchi (JP)

(73) Assignee: Tokuyama Corporation, Shunan-shi, Yamaguchi (JP)

( * ) Notice: Subject to any disclaimer, the term of this patent is extended or adjusted under 35 U.S.C. 154(b) by 599 days.

(21) Appl. No.: 10/560,159

(22) PCT Filed: Jun. 11, 2004

(86) PCT No.: PCT/JP2004/008584

§ 371 (c)(1),
(2), (4) Date: Dec. 12, 2005

(87) PCT Pub. No.: WO2004/110957

PCT Pub. Date: Dec. 23, 2004

(65) Prior Publication Data

US 2006/0156528 A1    Jul. 20, 2006

(30) Foreign Application Priority Data

Jun. 13, 2003   (JP) .............................. 2003-169795

(51) Int. Cl.
  *C04B 37/02*   (2006.01)
  *B32B 3/10*    (2006.01)
  *B32B 3/26*    (2006.01)

(52) U.S. Cl. .................... 428/698; 428/209; 428/304.4; 428/689; 428/469; 279/128; 156/89.27; 361/234; 29/832; 29/525.14; 29/525.15

(58) Field of Classification Search ................. 428/209, 428/304.4, 698, 650, 688, 689, 594; 501/98.4; 257/E23.009; 29/832, 428, 525.14, 525.15; 264/605; 438/763; 361/234; 279/128; 156/89.27
See application file for complete search history.

(56) References Cited

U.S. PATENT DOCUMENTS 4,055,451 A * 10/1977 Cockbain et al. ......... 156/89.27

(Continued)

FOREIGN PATENT DOCUMENTS

JP         4324276 A         11/1992

(Continued)

*Primary Examiner*—John J. Zimmerman
*Assistant Examiner*—Aaron Austin
(74) *Attorney, Agent, or Firm*—Birch, Stewart, Kolasch & Birch, LLP

(57) ABSTRACT

An aluminum nitride joined body comprising two pieces of aluminum nitride sintered body plates joined together without using adhesive, and a metal layer formed on a portion of the junction interface thereof, wherein, as viewed on a side section passing through the center of the joined body, a plurality of voids are existing in the directly joined region where the sintered body plates are directly facing each other on the junction interface, the voids having an average length L of 0.5 to 4 μm along the junction interface, thereby forming non-joined portions due to the voids, and a non-joined ratio Q on the side section as calculated by the following formula (1), Non-joined ratio $Q=(X/Y)\times 100$         (1)

where X is a length of the non-joined portion in the direction of junction interface expressed by the sum of lengths L of the voids existing in the directly joined region, and Y is a length of the directly joined region where the voids are existing, is in a range of from 0.1 to 0.5% on average. The AlN plate-like joined body has the metal layer contained therein that is effectively suppressed from warping, exhibits a large junction strength, excellent durability, and is useful as a plate heater or an electrostatic chuck for treating a semiconductor wafer that is placed thereon in an apparatus for producing a semiconductor.

8 Claims, 2 Drawing Sheets

U.S. PATENT DOCUMENTS

| | | | |
|---|---|---|---|
| 5,721,062 A | 2/1998 | Kobayashi | |
| 6,028,022 A * | 2/2000 | Ohashi | 501/152 |
| 6,071,465 A | 6/2000 | Kobayashi | |
| 6,261,708 B1 * | 7/2001 | Ohashi et al. | 428/698 |
| 6,423,400 B1 * | 7/2002 | Yushio et al. | 428/210 |
| 6,447,626 B1 * | 9/2002 | Ohashi | 156/89.27 |
| 6,475,924 B2 | 11/2002 | Yamamoto et al. | |
| 6,490,146 B2 * | 12/2002 | Wang et al. | 361/234 |
| 2003/0066587 A1 * | 4/2003 | Yushio et al. | 156/89.15 |
| 2004/0074586 A1 * | 4/2004 | Hiramatsu et al. | 156/89.11 |
| 2004/0175549 A1 * | 9/2004 | Ito | 428/209 |
| 2007/0212567 A1 * | 9/2007 | Esaki et al. | 428/650 |

FOREIGN PATENT DOCUMENTS

| | | |
|---|---|---|
| JP | 8073280 A | 3/1996 |
| JP | 2783980 B2 | 8/1998 |
| JP | 11-135906 A | 5/1999 |
| JP | 11-135906 A | 5/1999 |
| JP | 2000-114355 A | 4/2000 |
| JP | 2001-223256 A | 8/2001 |
| JP | 2001-223256 A | 8/2001 |
| JP | 2003-100580 A | 4/2003 |
| JP | 2003-100580 A | 4/2003 |
| WO | WO-03-008359 A1 | 1/2003 |
| WO | WO-03/008359 A1 | 1/2003 |

\* cited by examiner ized as a plate heater or as an electrostatic chuck for treating a semiconductor wafer plated thereon in an apparatus for producing a semiconductor. More specifically, the invention relates an aluminum nitride joined body having a joined structure in which two pieces of aluminum nitride sintered plates are joined together with a metal layer sandwiched therebetween, enabling the semiconductor wafer to be uniformly treated and exhibiting good durability.

BACKGROUND ART

A ceramic plate-like sintered body having a metal layer buried therein to work as a heater or an electrode, has been used as a plate for placing a semiconductor wafer such as silicon wafer thereon in an apparatus for producing a semiconductor by forming a film on the semiconductor wafer or etching the semiconductor wafer. For example, the one burying a metal layer therein as a heater is used as a plate heater, and the one burying an electrode therein is used as an electrostatic chuck. The electrostatic chuck further often has a metal layer buried therein to work as an electrode and as a heater.

As a ceramic material for use in the above applications in recent years, there has been used an aluminum nitride sintered body having a good thermal conductivity.

Due to an increased degree of integration as a result of technical innovation in recent years, further, it has been urged to further increase the precision. Besides, semiconductor wafers to be treated are becoming large in size. In a treatment for forming a film on the surface, for instance, it has been urged to form a uniform and thin film on the surface of the semiconductor wafer having a large area maintaining good precision. In the etching treatment, further, it has been urged to uniformly etch a variety of thin films having large areas formed on the semiconductor wafer.

In a plate-like sintered body of aluminum nitride used as the plate heater or the electrostatic chuck under the above circumstances, it is essential that the metal layer that is buried exists maintaining a uniform thickness from the semiconductor wafer placed on the sintered body.

To produce the plate-like sintered body of aluminum nitride burying the metal layer therein, there can be contrived a method of preparing a green sheet of aluminum nitride burying the metal layer therein, and firing the green sheet. According to this method, however, there remains a problem in that the metal layer is broken or deformed due to a change in the size during the sintering. Generally, therefore, a sintered body in the form of a plate or a sheet is prepared, and two sintered bodies are joined together via a metal layer. That is, the plate-like sintered body of aluminum nitride obtained by this method is in the form of a joined body in which two pieces of aluminum nitride sintered plates are joined together with a metal layer sandwiched therebetween effectively avoiding the above-mentioned problem caused by the dimensional change during the sintering.

When the aluminum nitride joined body is to be produced by the junction method, there is used an adhesive for joining the two pieces of sintered body plates. With the plate adhesive used so far, however, the adhering temperature is so high that the sintered body plates are deformed due to the heat at the time of junction arousing a problem of warping of the metal layer.

Therefore, a method has been proposed to improve the warping by using an adhesive which adheres at a decreased temperature (see Japanese Unexamined Patent Publication (Kokai) No. 2000-252045).

The above method improves the warping of the metal layer in the joined body to some extent still leaving, however, room for improvement. Besides, though the junction strength is maintained to a sufficient degree between the aluminum nitride layer and the metal layer, a problem still remains in that the junction strength decreases with the passage of time due to thermal hysteresis in the portions where the aluminum nitride sintered plates are directly faced to each other.

DISCLOSURE OF THE INVENTION

It is therefore an object of the present invention to obtain an aluminum nitride joined body in which two pieces aluminum nitride sintered body plates are joined together with a metal layer sandwiched therebetween, featuring a high junction strength suppressing the warping of the metal layer therein to a very small degree.

The present inventors have conducted keen study in order to solve the above problems. As a result, the inventors have succeeded in obtaining an aluminum nitride joined body by joining aluminum nitride sintered body plates by heating in two steps while controlling the temperature under the application of a particular pressure without using adhesive, maintaining a high junction strength suppressing the warping of the metal layer therein to a very small degree. The inventors have further analyzed the joined body obtained by the above method, have discovered that fine voids are characteristically remaining in the junction surface of the aluminum nitride sintered bodies stemming from the above method, and have finished the invention.

Namely, according to the present invention, there is provided an aluminum nitride joined body (hereinafter also referred to as AlN plate-like joined body) comprising two pieces of aluminum nitride sintered body plates joined together without using adhesive, and a metal layer formed on a portion of the junction interface thereof, wherein, as viewed on a side section passing through the center of the joined body, a plurality of voids are existing in the directly joined region where the sintered body plates are directly facing each other on the junction interface, the voids having an average length L of 0.5 to 4 μm along the junction interface, thereby forming non-joined portions due to the voids, and a non-joined ratio Q on the side section as calculated by the following formula (1), $$\text{Non-joined ratio } Q = (X/Y) \times 100 \tag{1}$$

where X is a length of the non-joined portion in the direction of junction interface expressed by the sum of lengths L of the voids existing in the directly joined region, and Y is a length of the directly joined region where the voids are existing, is in a range of from 0.1 to 0.5% on average.

According to the present invention, there is further provided a method of producing an aluminum nitride joined body comprising the steps of:

preparing two aluminum nitride sintered body plates;

forming a metal layer of a thickness of not larger than 20 μm on a portion of the surface of the one aluminum nitride sintered body plate;

forming a laminate by overlapping the other aluminum nitride sintered body plate on the one aluminum nitride sintered body plate in a manner that said metal layer is sandwiched therebetween;

heating said laminate at a temperature of 1650 to 1700° C. under a pressure of 5 to 100 kg/cm² for 0.5 to 4 hours; and heating said laminate at a temperature of higher than 1700° C. but not higher than 1800° C. while continuing the compression with said pressure for 2 to 8 hours.

Owing to the structure of the characteristic junction interface formed by the above particular joining method, the AlN plate-like joined body of the invention features a greatly suppressed warping of the metal layer making it possible to form a uniform electric field on any place of the metal layer when the electric field is established in the dielectric by applying a voltage to the metal layer.

Further, the junction without using adhesive features durability against the thermal hysteresis, and a highly reliable operation can be expected.

The AlN plate-like joined body of the invention can be very effectively used as an electrostatic chuck and a plate heater in the apparatus for producing a semiconductor.

BEST MODE FOR CARRYING OUT THE INVENTION

The invention will now be described in detail in conjunction with the accompanying drawings to which only, however, the invention is in no way limited.

(AlN Plate-Like Joined Body)

Figure 1:
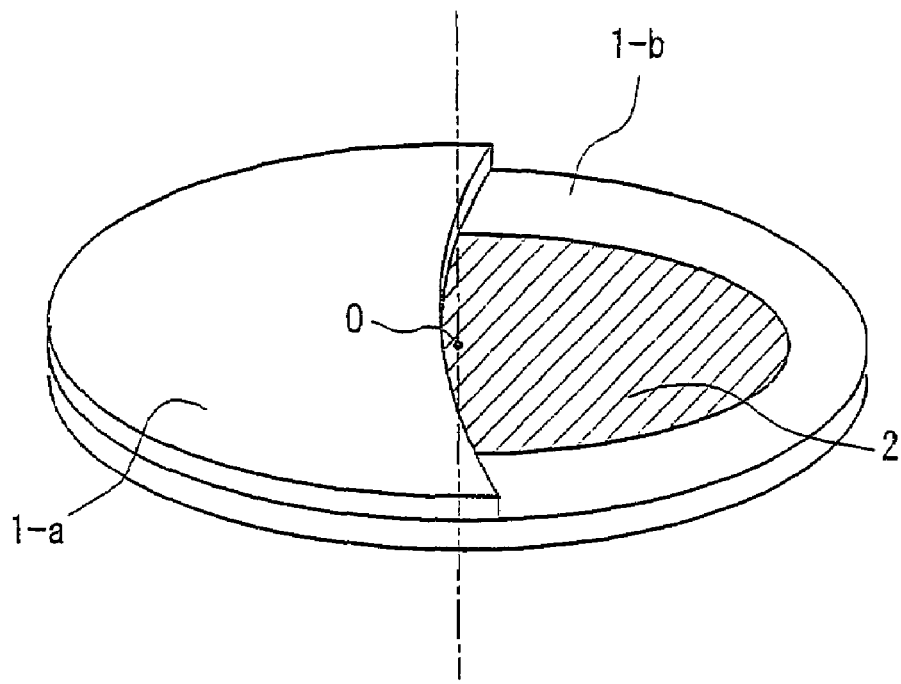
FIG. 1 is a perspective view illustrating, partly in a cutaway manner, a representative embodiment of an AlN plate-like joined body of the present invention.
Figure 2:
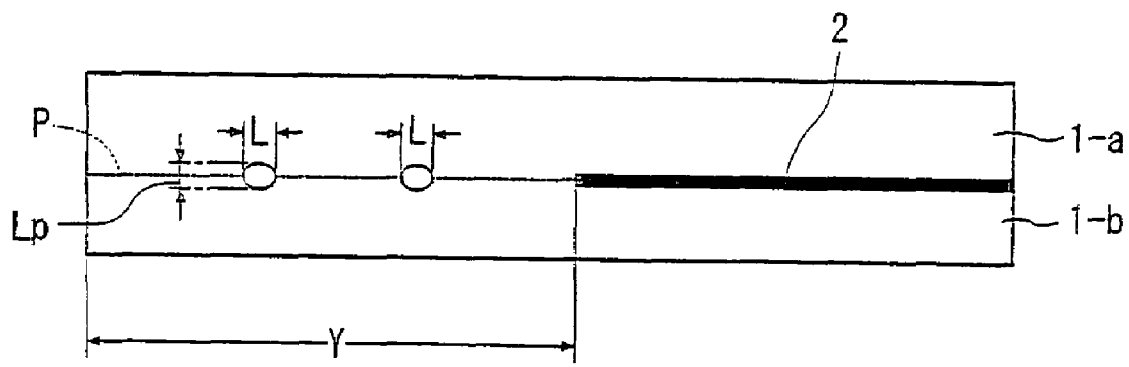
FIG. 2 is a view illustrating a major portion on a side section passing through the center O of the AlN plate-like joined body of FIG. 1.

In FIGS. 1 and 2, the AlN plate-like joined body of the invention has a junction structure in which two pieces of aluminum nitride sintered body plates 1-a and 1-b are joined together without using the adhesive, and a metal layer 2 is existing on a portion of the junction interface P (see FIG. 2). Though not illustrated, a through hole is formed in the sintered body plate 1-a or 1-b, and is filled with a conducting paste so as to be electrically conductive to the metal layer 2. The AlN plate-like joined body, usually, has a circular shape or a rectangular shape such as a square shape on a plane, and the metal layer 2 forms a circuit pattern such as electrode or heater in the application of a heater plate or an electrostatic chuck, and may exist simply all over as shown in FIG. 1 or may exist as a linear pattern.

Though there is no limitation, the metal layer 2 is made of tungsten, molybdenum, platinum, titanium or copper and has a thickness of not larger than 20 μm and, particularly, in a range of 5 to 15 μm. It is further desired that the ratio occupied by the metal layer 2 is, usually, 50 to 90% and, particularly, about 60 to about 80% relative to the junction surfaces of the sintered body plates 1-a and 1-b.

The aluminum nitride sintered body plates 1-a and 1-b of before being joined have thicknesses that are so determined that there will be obtained an AlN plate-like joined body having a desired thickness. For example, the sintered body plates 1-a and 1-b may have the same thickness or different thicknesses. In general, it is desired that the sintered body plate on the side on where the semiconductor wafer is mounted has a thickness smaller than the thickness of the other side and that the thicknesses of the sintered body plates 1-a and 1-b are so determined that the depth of the metal layer 2 from the surface of the one sintered body plate (from the side on the side on where the wafer is placed) is from 0.1 to 50% of the total thickness of the plate-like joined body. The total thickness of the AlN plate-like joined body is, usually, 1 to 100 mm though it may vary to some extent depending upon the use.

The AlN plate-like joined body of the invention is obtained by the junction through two steps of heating that will be described later without using adhesive while interposing the metal layer 2 between the aluminum nitride sintered body plates 1-a and 1-b, and exhibits characteristics as described below.

Namely, the junction strength of the AlN plate-like joined body of the present invention can be evaluated in terms of the shearing strength measured by using a die-shear tester, and is 9.5 to 11.0 kg/mm² and, particularly, 10.0 to 11.0 kg/mm² between the sintered body plates, and is 2.5 to 4.0 kg/mm² and, particularly, 3.0 to 4.0 kg/mm² between the sintered body plate and the metal layer. In the present invention, the joined body is constituted maintaining such a high junction strength and, hence, has a decreased interface relative to the material of a different kind (no adhesive layer exists) and permits the junction strength to be decreased little even after the repetitive thermal hysteresis as compared to the joined body prepared by using an adhesive. When the AlN plate-like joined body of the invention is subjected to the thermal hysteresis, for example, 100 times by raising and lowering the temperature between 25° C. and 350° C., the shearing strength of the junction surface between the metal layer and the aluminum nitride sintered body is not smaller than 90% of the shearing strength of before the thermal hysteresis, which is a very favorable resistance against the thermal hysteresis.

Figure 3:
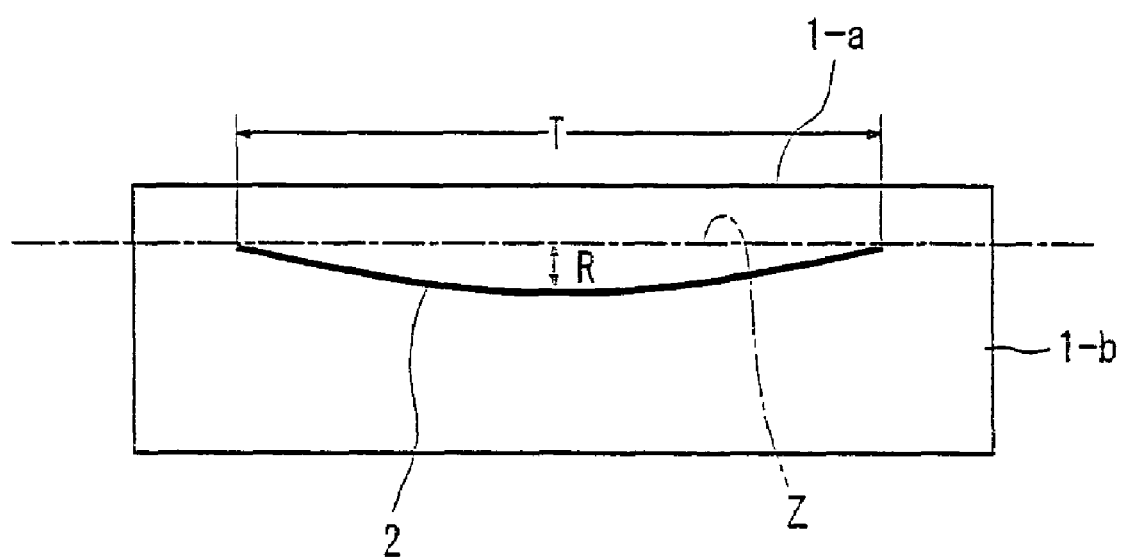
FIG. 3 is a view schematically illustrating the warping of a metal layer occurring in the AlN plate-like joined body.

Further, the greatest feature of the AlN plate-like joined body of the invention resides in that the metal layer 2 is warped very little. Referring to FIG. 3, the warping (W) of the metal layer 2 is found by measuring a maximum distance (R; μm) between the metal layer 2 and a line Z (dot-dash chain line) connecting the end points of the metal layer 2 on a cross section at right angles with the metal layer 2, and by dividing it by the length (T; mm) between the end points according to the following formula (2), $$W(\mu m/10\ mm) = (R/T) \times 10 \qquad (2)$$

The AlN plate-like joined body of the invention is warped by 5 to 25 μm/10 mm and, particularly, by 10 to 20 μm/10 mm, featuring excellent property.

Such an excellently low warping property is never accomplished with the conventional AlN plate-like joined body using the adhesive, but is accomplished for the first time relying upon a special junction technology based on two-step heating that will be described later.

The joined body of the invention is realizing a low warping relying upon the special junction technology that will be described later. As illustrated in FIG. 2, therefore, the joined body of the present invention has a special junction structure in that a plurality of voids having an average length of 0.5 to 4 μm are existing along the junction surface in the directly joined region where the sintered body plates are directly facing each other on the junction surface P as viewed in cross section passing through the center O of the joined body. The voids are distributed over the whole directly joined region, and are having lengths L which are shorter than 5 μm and having shapes close to a sphere. The ratio (L/Lp) of the length L along the direction of junction interface to the length Lp in a direction perpendicular to the junction interface is in a range of 0.8 to 2 and, particularly, 1.0 to 1.5 on average. In the AlN plate-like joined body of the present invention, the sintered body plates 1-*a* and 1-*b* are not partly joined due to the presence of voids. If the non-joined ratio Q is calculated at a plurality of given places in the above cross section according to the following formula (1), $$\text{Non-joined ratio } Q = (X/Y) \times 100 \quad (1)$$

where X is a length of the non-joined portion in the direction of junction interface expressed by the sum of lengths L of the voids existing in the directly joined region, and Y is a length of the directly joined region where the voids are existing, the value is in a range of from 0.1 to 0.5% and, particularly, from 0.2 to 0.4% on average.

The size of the voids and the non-joined ratio can be measured by cutting the plate-like joined body in a manner that the side section appears and by observing the cut section by using an electron microscope.

(Method of Producing the AlN Plate-Like Joined Body)

Described below is a method of producing the AlN plate-like joined body of the present invention having the above-mentioned structure.

According to this production method, AlN sintered plates are prepared in advance. Namely, two pieces of AlN sintered plates are joined together by heating without using adhesive with the metal layer sandwiched therebetween. If briefly described, a distinguished feature resides in that the junction by heating is effected through two steps of heating. Namely, the junction by heating through the first step is effected in a low-temperature region where the sintered body thermally expands relatively little. In this case, a partial co-sintering occurs between the sintered plates, and the two pieces of sintered plates are temporarily secured. The subsequent junction by heating through the second step is effected in a temperature region higher than that of the junction by heating through the first step. Namely, the co-sintering proceeds while maintaining the secured state due to the junction by heating through the first step, and a firmly joined portion is formed.

By effecting the junction by heating through two steps, the partial co-sintering gradually proceeds to finally form a joined portion (directly joined region in FIG. 2). Therefore, fine and nearly spherical voids remain between the co-sintered portions that have grown. Such voids are distributed nearly homogeneously maintaining the above-mentioned sizes over the whole joined portion. Non-joined portions are formed by the voids, and the non-joined ratio Q expressed by the above formula (1) lies within a predetermined range on the junction interface. Thus, the junction is accomplished without using an adhesive. The AlN plate-like joined body of the invention having the above junction structure features a high junction strength and resistance against the thermal hysteresis, and effectively suppresses the metal layer from warping. Besides, since no adhesive is used, the grain boundary migration does not take place to a conspicuous degree, and the warping occurs little.

When, for example, the junction by heating is effected through one step near a sintering temperature of the aluminum nitride sintered body, the non-joined portions remain as the junction proceeds. At the time of junction, however, the junction interface has a degree of freedom. In the step of cooling, therefore, the junction interface is secured at a relatively high temperature. After cooled, therefore, the joined body tends to be distorted and warped. Further, since the junction interface has a degree of freedom at the time of junction, the voids tend to be migrated or deformed; i.e., large voids exist in a deviated manner, or voids exist much in a shape crushed in the direction of a plane (having a large length L in the direction of junction interface), whereby the non-joined ratio Q assumes a considerably large value resulting in a decrease in the junction strength and resistance against the thermal hysteresis. Preparation of the AlN sintered body plates 1-*a* and 1-*b*.

In this invention, the AlN sintered body plates to be joined by heating can be produced by a known method. For example, the powder for firing comprising the AlN powder is mixed together with an organic binder to prepare a molding material such as a powder for granulation or a paste. The molding material is molded into a sheet, and the binder is removed from the obtained green sheet followed by firing thereby to obtain the AlN sintered body plates.

As required, the powder for firing may be added with an oxide of an alkaline earth metal such as Mg, Ca or Sr or an oxide of a rare earth element such as Y, as a sintering assistant. The sintering assistant is added, usually, in an amount of not larger than 1% by weight and, particularly, not larger than 0.5% by weight.

Further, though there is no particular limitation, the organic binder is, generally, polyvinyl butyral, polymethyl methacrylate, carboxymethyl cellulose, polyvinyl pyrrolidone, polyethylene glycol, polyethylene oxide, polyethylene, polypropylene, ethylene/vinyl acetate copolymer, polystyrene, or polyacrylic acid. The organic binder is used, usually, in an amount of 0.1 to 30 parts by weight per 100 parts by weight of the powder for sintering, though the amount may vary depending upon the kind thereof.

In preparing the material for molding, further, there are used, as required, a dispersant such as long-chain hydrocarbon ether, a solvent such as toluene or ethanol, and a plasticizer such as phthalic acid in suitable amounts.

The sheet for molding (green sheet) is prepared by using the above material for molding relying upon a known molding method such as extrusion molding method, doctor blade method or press molding method.

The binder is removed by, usually, heating the green sheet in the air at a temperature of about 300 to about 900° C., and the firing is effected by heating the green sheet from which the binder has been removed in an inert atmosphere (e.g., nitrogen atmosphere) at a temperature of 1700 to 1900° C. The firing is, usually, conducted for a period of time until the relative density becomes not smaller than 98% as measured by the Archimedes' method.

It is desired that the AlN sintered body plates obtained as described above are ground such that the surface roughness Ra (JIS B 0601) becomes 0.1 to 0.8 µm and, preferably, 0.2 to 0.6 µm in order to enhance the adhesion between the metal layer 2 and the sintered plates and to obtain a sufficiently large junction strength by the junction by heating without using adhesive.

Formation of the Metal Layer 2.

A metal layer 2 is formed on either one of the AlN sintered body plate 1-*a* or 1-*b* prepared as described above.

The metal layer 2 is formed by using, for example, the above-mentioned metal material to possess a predetermined thickness (not larger than 20 µm and, particularly, 5 to 15 µm) by such means as ion plating through a predetermined mask. The metal layer 2 can be further formed by applying a conductive paste onto the surface of the sintered body plate in a predetermined pattern followed by firing, the conductive paste being obtained by dispersing a metal material in a suitable organic binder or an organic solvent.

Junction by Heating.

In the present invention, the two pieces of AlN sintered body plates prepared as described above (the metal layer 2 has been formed on one of them) are overlapped one upon the other in a manner that the metal layer 2 is sandwiched therebetween, and are joined by heating through two steps while being pressed with a pressure of 5 to 100 kg/cm² and, preferably, 10 to 30 kg/cm². The junction by heating can be effected in either the atmosphere or in an inert atmosphere (nitrogen atmosphere). From the standpoint of preventing the oxidation of the metal material, however, it is desired that the junction by heating is effected in the inert atmosphere.

The junction by heating in the first step is conducted at a temperature of 1650 to 1700° C. and, preferably, 1650 to 1680° C. for 0.5 to 4 hours and, preferably, for 1 to 2 hours. As described earlier, the junction by heating in this step is conducted in a low-temperature region where the AlN sintered body thermally expands relatively little, and the co-sintering partly occurs between the sintered body plates. Thus, the two pieces of sintered body plates are temporarily secured. If the junction by heating is discontinued in this step, therefore, the shearing strength in the region where the two pieces of sintered body plates are joined together is, usually, as considerably low as about 1.0 to about 4.0 kg/mm².

After the junction by heating in the first step, heating is effected in the second step while maintaining the pressure to thereby obtain the AlN plate-like joined body as desired. Here, the heating temperature is higher than 1700° C. but is not higher than 1800° C. and, preferably, in a range of 1750 to 1790° C., and the heating time is 2 to 8 hours and, preferably, 4 to 6 hours. That is, in the heating in the second step, the co-sintering further proceeds to form the joined portion while maintaining the secured state due to the junction by heating in the first step. Therefore, voids are distributed in the region where two pieces of sintered body plates are directly joined together, and non-joined portions are occurring due to voids. The voids are nearly of a spherical shape which is considerably uniform and fine as a whole, and the non-joined ratio Q lies in a considerably small range maintaining a high junction strength. Besides, the warping of the metal layer 2 is effectively suppressed.

In the junction by heating through the above two steps, when the heating temperature in the first step is higher than the above range, the metal layer 2 is greatly warped in the obtained plate-like joined body, and the joined body itself is greatly warped. The joined body obtained under the above conditions has a ratio of void lengths (L/Lp) which is considerably greater than that of the present invention generating much voids having a large length in the direction of junction interface and having a slender shape, and possesses a considerably large non-joined ratio Q and a very decreased junction strength.

When the heating temperature of the first step is lower than the above range or when the heating time is shorter than the above range, the temporary securing is not sufficient. Therefore, large voids occur much, the non-joined ratio Q increases, the junction strength decreases, and warping occurs. When the heating time in the first step is longer than the above range, the metal forming the metal layer 2 diffuses into the sintered body plate. Therefore, the metal layer 2 is nonuniformly distributed in the joined plates which, therefore, cannot be favorably used as an electrostatic chuck or a plate heater for the apparatus for producing a semiconductor.

Even when the heating temperature in the second step is higher than the above range, the metal forming the metal layer 2 diffuses into the sintered body plates; i.e., the metal layer 2 is distributed nonuniformly.

When the heating temperature of the second step is lower than the above range, the co-sintered portion grows insufficiently and the junction strength is not obtained to a sufficient degree. In this case, the non-joined ratio Q assumes a very large value, as a matter of course.

Even when the heating time in the second step is shorter than the above range, the co-sintered portion grows insufficiently and the junction strength decreases. When the heating time is longer than the above range, the warping increases.

The AlN plate-like joined body of the invention obtained by the junction in two steps is not warped, has the metal layer uniformly distributed in the joined plates, has a high junction strength and excellent resistance against the thermal hysteresis, lending itself very well for use as an electrostatic chuck or as a plate heater in an apparatus for producing a semiconductor.

EXAMPLES

Effects of the invention will now be described in further detail by way of Examples and Comparative Examples. Here, it should be noted that the invention is in no way limited to Examples described below.

In Examples and Comparative Examples, measurements were taken in accordance with the methods described below.

(1) Non-Joined Ratio Q.

The AlN joined body was cut into four sections from the center O thereof toward the outer side at an angular distance of 90 degrees, and the interfaces of the sintered plates at the cut sections were continuously photographed by using a scanning type electron microscope (SEM) at a magnification of 600 times. Relying upon this photograph, the length Ln along the junction interface (n=1 to N; N is the total number of voids existing in the interface) was found for each of the voids existing in the junction interface where the sintered plates were directly joined to each other. The non-joined ratio Q was found for each of the cut sections in accordance with the following formula to obtain an average value thereof.

$$\text{Non-joined ration } Q(\%) = \frac{\sum_{n=1}^{N} L_n}{Y} \times 100$$

where Y is a total length of the directly joined region observed by using the SEM.

(2) Ratio (L/Lp) of Lengths of Voids.

On the cut sections, the length (L) of the void along the junction interface and length Lp in the direction perpendicular to the junction interface were measured to find a ratio (L/Lp) on average.

(3) Measurement of Warping (W) of the Metal Layer.

The cut sections obtained by dividing the AlN plate-like joined body into two were measured for the remotest distance (R; μm) of the metal layer from a line Z (dot-dash chain line) connecting the end points of the metal layer relying upon the length (T; mm) between the end points in compliance with the following formula (2), and the greatest value was expressed as the warping of the metal layer, $$W(\mu m/10\text{ mm}) = (R/T) \times 10 \quad (2)$$

(4) Resistance Against the Thermal Hysteresis.

The AlN plate-like joined body was introduced into a thermal shock chamber (model TSC-103(W) manufactured by Especk Co.), heated from 25° C. up to 350° C. over 30 minutes and was, then, cooled down to 25° C. over 30 minutes. This cycle of elevating and lowering the temperature was repeated 100 times to measure the shearing strength of the junction interface of the joined body before and after the thermal hysteresis, and resistance against the thermal hysteresis was calculated according to the following formula, Resistance against the thermal hysteresis (%)=shearing strength after the thermal hysteresis×100/shearing strength before the thermal hysteresis Example 1

A metal layer (1.2 μm thick) was formed on one surface of an AlN sintered plate of a diameter of 40 mm and a thickness of 6 mm (SH-50 manufactured by Tokuyama Co., $Y_2O_3$: 0.02% by weight, surface roughness Ra: 0.4 μm) by forming films of Ti of a thickness of 0.2 μm and of W of a thickness of 1 μm by the ion-plating method while covering the outer circumferential portion over a width of 5 mm with an aluminum mask.

Next, another AlN sintered plate (SH-50) without forming the metal layer was overlapped on the above sintered plate forming the metal layer in such a manner that the metal layer was on the inside, and the plates were secured to a sample jig made of carbon, and were put into a hot-pressing furnace. Thereafter, the plates were held in a nitrogen stream heated at 1650° C. for 2 hours under a load of 300 kgf (pressure of 23.9 kg/cm$^2$), and the temperature was elevated up to 1750° C. at a rate of 10° C./min. The plates were held at this temperature for 4 hours. Then, the temperature was cooled down to room temperature, and an AlN plate-like joined body was taken out from the furnace.

The conditions for producing the AlN plate-like joined body and various characteristics were as illustrated in Tables 1 and 2.

The warping W of the metal layer of the AlN plate-like joined body was 12 μm/10 mm, the shearing strength of the junction interface was 3.8 kgf/mm$^2$ on the interface including the metal layer and was 10 kgf/mm$^2$ on the interface without containing the metal layer (interface where the sintered plates were directly joined together), and resistance against the thermal hysteresis was 100%. The non-joined ratio Q was 0.2%, the average length of voids in the direction of junction interface was 1.8 μm on average, and the ratio L/Lp of lengths of voids was 1.1 on average.

Example 2

A metal layer (1.2 μm thick) was formed on one surface of an AlN sintered plate of a diameter of 326 mm and a thickness of 10 mm (the composition and the like were the same as those of Example 1) by forming films of Ti and W in the same manner as in Example 1. Then, the metal layer (Ti/W films) of a width of 17 mm from the outer circumference was removed by using a mixed solution of 5 vol % of hydrofluoric acid and 5 vol % of nitric acid at a ratio of 1:1 while masking a region of a radius of 146 mm from the center of the metal layer.

Next, another AlN sintered plate (SH-50) without forming the metal layer was overlapped on the above sintered plate in such a manner that the metal layer was on the inside, and the plates were secured to a sample jig made of carbon, and were put into a hot-pressing furnace. Thereafter, the plates were held in a nitrogen stream heated at 1690° C. for 2 hours under a load of 20 tf (pressure of 24.0 kg/cm$^2$), and the temperature was elevated up to 1790° C. at a rate of 3° C./min. The plates were held at this temperature for 4 hours. Then, the temperature was cooled down to room temperature, and an AlN plate-like joined body was taken out from the furnace.

The conditions for producing the AlN plate-like joined body and various characteristics were as illustrated in Tables 1 and 2.

The warping W of the metal layer of the AlN plate-like joined body was 17 μm/10 mm, the shearing strength of the junction interface was 3.5 kgf/mm$^2$ on the interface including the metal layer and was 10 kgf/mm$^2$ on the interface without containing the metal layer (interface where the sintered plates were directly joined together), and resistance against the thermal hysteresis was 100%.

The non-joined ratio Q was 0.2%, the average length of voids in the direction of junction interface was 2.4 μm on average, and the ratio L/Lp of lengths of voids was 1.2 on average.

Examples 3 to 5

AlN plate-like joined bodies were obtained by the same method as that of Example 1 by using the AlN sintered plates having the diameter and the thickness same as those of Example 1 but varying the conditions for junction by heating (holding temperature, holding time, load).

The conditions for producing the AlN plate-like joined bodies and various characteristics were as illustrated in Tables 1 and 2.

Example 6

An AlN plate-like joined body was obtained by forming metal layers of Ti (0.2 μm) and W (9 μm) on one surface of the same AlN sintered plate as that of Example 1 in the same manner as in Example 1 and by effecting the junction by heating under the same conditions as those of Example 1.

The conditions for producing the AlN plate-like joined body and various characteristics were as illustrated in Tables 1 and 2.

The warping W of the metal layer of the AlN plate-like joined body was 19 μm/10 mm, the shearing strength of the junction interface was 3.1 kg/mm$^2$ on the interface including the metal layer and was 10 kg/mm$^2$ on the interface without containing the metal layer (interface where the sintered plates were directly joined together), and resistance against the thermal hysteresis was 99%. The non-joined ratio Q was 0.2%, the average length of voids in the direction of junction interface was 3.8 μm on average, and the ratio L/Lp of lengths of voids was 1.2 on average.

Comparative Example 1

An AlN sintered plate forming a metal layer (Ti/W) on one surface thereof was prepared in quite the same manner as in Example 1.

Next, an AlN—$Y_2O_3$ slurry (AlN: 100 parts by weight, $Y_2O_3$: 5 parts by weight, acrylic binder: 4 parts by weight, long-chain hydrocarbon ether-type dispersant: 0.5 parts by weight) was applied as an adhesive to the AlN sintered plate on which no metal layer had been formed. This AlN sintered plate was, then, overlapped on the above sintered plate in such a manner that the metal layer was on the inside, and the laminated plates were secured to a sample jig made of carbon and were put into a hot-pressing furnace.

Thereafter, the plates were held in a nitrogen stream heated at 1650° C. for 2 hours under a load of 300 kgf (pressure of 23.9 kg/cm$^2$), and the temperature was elevated up to 1750° C. at a rate of 10° C./min. The plates were held at this temperature for 4 hours. Then, the temperature was cooled down to room temperature, and the plates were taken out from the furnace to obtain an AlN plate-like joined body that had been joined with an adhesive layer.

The obtained AlN plate-like joined body had been apparently warped like a cup as viewed by naked eyes. The AlN plate-like joined body was ground for its surfaces to be flat. The warping of the metal layer was measured to be 297 μm/10 mm. Further, the shearing strength of the junction interface was measured to be 2.0 kg/mm$^2$ on the interface including the metal layer and 6 kg/mm$^2$ on the interface without containing the metal layer (interface where the sintered plates were directly joined together), and resistance against the thermal hysteresis was 68%. Next, the non-joined ratio Q was found to be 21.1%, the average length of voids in the direction of junction interface was 6.5 μm on average, and the ratio L/Lp of lengths of voids was 4.8 on average.

Comparative Example 2

An AlN plate-like joined body was obtained by the same method as that of Comparative Example 1 by using AlN sintered plates having the same diameter and thickness as those of Example 1 but varying the conditions for junction by heating (holding temperature, holding time, load).

The conditions for producing the AlN plate-like joined body and various characteristics were as illustrated in Tables 1 and 2.

Comparative Examples 3 to 9

AlN plate-like joined bodies were obtained by the same method as that of Comparative Example 1 by using AlN sintered plates having the same diameter and thickness as those of Example 1 but varying the conditions for junction by heating (holding temperature, holding time, load).

The conditions for producing the AlN plate-like joined bodies and various characteristics were as illustrated in Tables 1 and 2.

TABLE 1

| | Content of sintering assistant (%) | Sample size (mm) | Surface roughness Ra (μm) | Metal layer thickness ((μm) | Metal layer ratio on junction surface (%) | Presence of adhesive | Junction temp. 1 (° C.) | Junction time 1 (hr) | Junction temp. 2 (° C.) | Junction time 2 (hr) | Load (t) | Pressure (kg/cm$^2$) |
|---|---|---|---|---|---|---|---|---|---|---|---|---|
| Ex.1 | 0.02 | Φ40xt6 | 0.4 | 1.2 | 57 | none | 1650 | 2 | 1750 | 4 | 0.3 | 23.9 |
| Ex.2 | 0.02 | Φ326xt10 | 0.4 | 1.2 | 80 | none | 1690 | 2 | 1790 | 4 | 20 | 24.0 |
| Ex.3 | 0.02 | Φ40xt6 | 0.4 | 1.2 | 57 | none | 1650 | 1 | 1750 | 2 | 0.3 | 23.9 |
| Ex.4 | 0.02 | Φ40xt6 | 0.4 | 1.2 | 57 | none | 1650 | 1 | 1750 | 8 | 0.3 | 23.9 |
| Ex.5 | 0.02 | Φ40xt6 | 0.4 | 1.2 | 57 | none | 1650 | 2 | 1750 | 4 | 1 | 79.6 |
| Ex.6 | 0.02 | Φ40xt6 | 0.4 | 9.2 | 57 | none | 1650 | 2 | 1750 | 4 | 0.3 | 23.9 |
| Co.Ex.1 | 0.02 | Φ40xt6 | 0.4 | 1.2 | 57 | presence[*1] | 1650 | 2 | 1750 | 4 | 0.3 | 23.9 |
| Co.Ex.2 | 0.02 | Φ40xt6 | 0.4 | 1.2 | 57 | presence[*1] | 1850 | 6 | — | — | 0.3 | 23.9 |
| Co.Ex.3 | 0.02 | Φ40xt6 | 0.4 | 1.2 | 57 | none | 1750 | 6 | — | — | 0.3 | 23.9 |
| Co.Ex.4 | 0.02 | Φ40xt6 | 0.4 | 1.2 | 57 | none | 1800 | 8 | — | — | 0.3 | 23.9 |
| Co.Ex.5 | 0.02 | Φ40xt6 | 0.4 | 1.2 | 57 | none | 1600 | 2 | 1750 | 4 | 0.3 | 23.9 |
| Co.Ex.6 | 0.02 | Φ40xt6 | 0.4 | 1.2 | 57 | none | 1650 | 0.2 | 1750 | 4 | 0.3 | 23.9 |
| Co.Ex.7 | 0.02 | Φ40xt6 | 0.4 | 1.2 | 57 | none | 1650 | 2 | 1680 | 8 | 0.3 | 23.9 |
| Co.Ex.8 | 0.02 | Φ40xt6 | 0.4 | 1.2 | 57 | none | 1650 | 2 | 1750 | 0.5 | 0.3 | 23.9 |
| Co.Ex.9 | 0.02 | Φ40xt6 | 0.4 | 1.2 | 57 | none | 1650 | 2 | 1750 | 4 | 0 | 0 |

[*1]AlN-Y$_2$O$_3$

TABLE 2

| | Warping W (μm) | Shearing strength (including metal layer) (kg/mm2) | Shearing strength (kg/mm$^2$) | Resistance to thermal hysteresis (%) | Non-joined ratio Q (%) | Length L of voids (μm) (average) | Ratio of lengths of voids (ave. L/Lp) |
|---|---|---|---|---|---|---|---|
| Ex.1 | 12 | 3.8 | 10.0 | 100 | 0.2 | 1.8 | 1.1 |
| Ex.2 | 17 | 3.5 | 10.0 | 100 | 0.2 | 2.4 | 1.2 |
| Ex.3 | 13 | 3.1 | 10.0 | 99 | 0.2 | 3.4 | 1.1 |
| Ex.4 | 18 | 3.2 | 10.0 | 99 | 0.4 | 1.5 | 1.4 |
| Ex.5 | 18 | 3.5 | 10.0 | 100 | 0.3 | 1.5 | 1.3 |
| Ex.6 | 19 | 3.1 | 10.0 | 99 | 0.2 | 3.8 | 1.2 |
| Comp.Ex.1 | 297 | 2.0 | 6.0 | 68 | 21.1 | 6.5 | 4.8 |
| Comp.Ex.2 | 285 | 1.8 | 6.8 | 96 | 8.5 | 6.1 | 5.1 |
| Comp.Ex.3 | 250 | 1.8 | 5.0 | 86 | 12.5 | 5.2 | 6.5 |
| Comp.Ex.4 | 288 | 1.8 | 5.0 | 75 | 12.5 | 5.1 | 6.5 |
| Comp.Ex.5 | 285 | 2.0 | 3.0 | 88 | 11.5 | 5.6 | 8.2 |
| Comp.Ex.6 | 244 | 3.0 | 6.0 | 79 | 11.0 | 5.6 | 7.2 |
| Comp.Ex.7 | 28 | 1.5 | 2.7 | 89 | 22.1 | 5.4 | 3.1 |
| Comp.Ex.8 | 89 | 2.8 | 2.5 | 95 | 30.0 | 5.8 | 3.0 |
| Comp.Ex.9 | 350 | 0.5 | 0.2 | 70 | 52.0 | 6.2 | 9.2 |

The invention claimed is:

1. An aluminum nitride joined body comprising two pieces of aluminum nitride sintered body plates joined together without using adhesive, and a metal layer formed on a portion of the junction interface thereof, wherein, as viewed on a side section passing through the center of the joined body, a plurality of voids are existing in the directly joined region where the sintered body plates are directly facing each other on the junction interface, the voids having an average length L of 0.5 to 4 µm along the junction interface, thereby forming non-joined portions due to the voids, and a non-joined ratio Q on the side section as calculated by the following formula (1), $$\text{Non-joined ratio } Q=(X/Y)\times 100 \quad (1)$$

where X is a length of the non-joined portion in the direction of junction interface expressed by the sum of lengths L of the voids existing in the directly joined region, and Y is a length of the directly joined region where the voids are existing, is in a range of from 0.1 to 0.5% on average.

2. An aluminum nitride joined body as set forth in claim 1, wherein voids having lengths L of not smaller than 5 µm are not substantially existing in said directly coupled region.

3. An aluminum nitride joined body as set forth in claim 1 or 2, wherein a ratio (L/Lp) of the length L of said voids in the direction of junction interface to the length Lp thereof in a direction perpendicular to the junction interface is 0.8 to 2 on average.

4. An aluminum nitride joined body as set forth in claim 1, wherein the warping in said metal layer is not larger than 25 µm/10 mm.

5. An aluminum nitride joined body as set forth in claim 1, wherein the thickness is 1 to 100 mm.

6. An aluminum nitride joined body as set forth in claim 1, wherein after the thermal hysteresis of elevating and lowering the temperature between 25° C. and 350° C. is repeated 100 times, the shearing strength of the junction surface between the metal layer and the aluminum nitride sintered body plate is not smaller than 90% of the shearing strength of before the thermal hysteresis.

7. A method of producing an aluminum nitride joined body comprising the steps of:

preparing two aluminum nitride sintered body plates;

forming a metal layer of a thickness of not larger than 20 µm on a portion of the surface of the one aluminum nitride sintered body plate;

forming a laminate by overlapping the other aluminum nitride sintered body plate on the one aluminum nitride sintered body plate in a manner that said metal layer is sandwiched therebetween;

heating said laminate at a temperature of 1650 to 1700° C. under a pressure of 5 to 100 kg/cm2 for 0.5 to 4 hours; and heating said laminate at a temperature of higher than 1700° C. but not higher than 1800° C. while continuing the compression with said pressure for 2 to 8 hours.

8. A method of producing an aluminum nitride joined body as set forth in claim 6, wherein the aluminum nitride sintered body plate has an average surface roughness Ra (JIS B 0601) in a range of 0.1 to 0.8 µm.

* * * * *